United States Patent
Hesse

(10) Patent No.: US 10,274,998 B2
(45) Date of Patent: Apr. 30, 2019

(54) HOLDING COMPONENT, SUPPORT COMPONENT AND ASSEMBLY

(71) Applicant: FUJITSU LIMITED, Kawasaki-shi, Kanagawa (JP)

(72) Inventor: Ronny Hesse, Bad Lippspringe (DE)

(73) Assignee: FUJITSU LIMITED, Kawasaki (JP)

( * ) Notice: Subject to any disclaimer, the term of this patent is extended or adjusted under 35 U.S.C. 154(b) by 78 days.

(21) Appl. No.: 15/447,930

(22) Filed: Mar. 2, 2017

(65) Prior Publication Data
US 2017/0280578 A1    Sep. 28, 2017

(30) Foreign Application Priority Data

Mar. 22, 2016 (DE) .................. 10 2016 105 322

(51) Int. Cl.
 *G06F 1/18* (2006.01)
 *H05K 5/00* (2006.01)
 (Continued)

(52) U.S. Cl.
 CPC .......... *G06F 1/185* (2013.01); *H01R 12/7005* (2013.01); *H01R 12/721* (2013.01);
 (Continued)

(58) Field of Classification Search
 CPC ..... G06F 1/1658; G06F 1/185; H05K 7/1461; H05K 7/1417; H05K 7/1487
 See application file for complete search history.

(56) References Cited

U.S. PATENT DOCUMENTS

| 4,979,075 A * | 12/1990 | Murphy .................. G06F 1/184 29/830 |
| 5,338,214 A * | 8/1994 | Steffes .................... G06F 1/184 361/679.32 |

(Continued)

FOREIGN PATENT DOCUMENTS

| DE | 102007058724 B3 | 5/2009 |
| DE | 102008034704 B3 | 12/2009 |

(Continued)

OTHER PUBLICATIONS

GBSR—Search Report of U.K. Patent Application No. GB1703246.7, search conducted on Aug. 15, 2017.

*Primary Examiner* — Nidhi Thaker
(74) *Attorney, Agent, or Firm* — Fujitsu Patent Center

(57) ABSTRACT

The invention relates to a holding component with a riser card for receiving an expansion component for a computer system. The riser card comprises a first mating plug connector on a first side of a bottom plate of the holding component. Further, the riser card comprises a first plug connector on a second side of the bottom plate opposite the first side. The holding component is adapted to receive the expansion component by establishing a plug connection of a second plug connector of the expansion component and the first mating plug connector on the holding component, wherein the holding component comprises a slot bracket, which is adapted to receive a slot angle of the expansion component.

Figure 1:
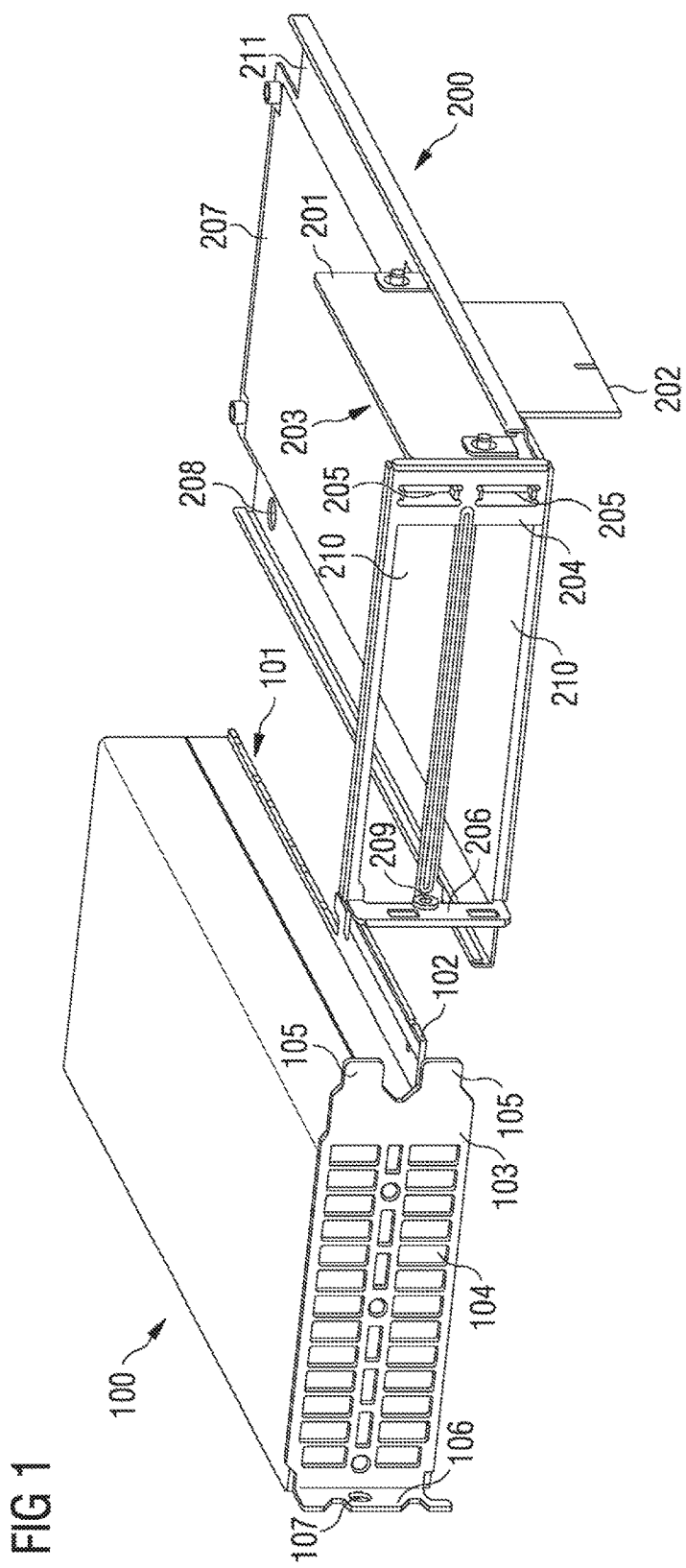

Furthermore, the invention relates to a support component for receiving at least one holding component and to an assembly comprising a chassis of a server module and of a holding component as well as of a support component.

12 Claims, 6 Drawing Sheets

(51) Int. Cl.
 *H05K 5/02* (2006.01)
 *H05K 7/14* (2006.01)
 *H01R 12/70* (2011.01)
 *H01R 12/72* (2011.01)

(52) U.S. Cl.
 CPC ......... *H05K 5/0069* (2013.01); *H05K 5/0269* (2013.01); *H05K 7/1417* (2013.01); *H05K 7/1461* (2013.01); *H05K 7/1487* (2013.01)

(56) References Cited

U.S. PATENT DOCUMENTS

| | | | | |
|---|---|---|---|---|
| 8,961,214 | B2 * | 2/2015 | Zhu | G06F 1/186 |
| | | | | 439/345 |
| 9,214,745 | B1 * | 12/2015 | Li | G11B 33/128 |
| 9,629,291 | B1 * | 4/2017 | Chen | G06F 1/185 |
| 9,913,394 | B2 * | 3/2018 | Blume | H05K 7/1487 |
| 2009/0147492 | A1 | 6/2009 | Heinrichs et al. | |
| 2010/0254096 | A1 * | 10/2010 | Kim | G06F 1/185 |
| | | | | 361/737 |
| 2010/0254100 | A1 * | 10/2010 | Kim | H05K 7/1461 |
| | | | | 361/752 |
| 2011/0075358 | A1 | 3/2011 | Fietz et al. | |
| 2011/0292590 | A1 | 12/2011 | Fietz et al. | |
| 2012/0020037 | A1 | 4/2012 | Chiu et al. | |
| 2013/0027875 | A1 | 1/2013 | Zhu et al. | |
| 2014/0049901 | A1 | 2/2014 | Zhu | |
| 2014/0168910 | A1 * | 6/2014 | Yin | G06F 1/185 |
| | | | | 361/747 |
| 2015/0009617 | A1 | 1/2015 | Yin et al. | |
| 2015/0208543 | A1 | 7/2015 | Chen et al. | |
| 2017/0265323 | A1 | 9/2017 | Blume et al. | |

FOREIGN PATENT DOCUMENTS

| | | |
|---|---|---|
| DE | 102008061031 A1 | 6/2010 |
| DE | 102013101842 B3 | 4/2014 |
| DE | 10 2014 114 790 B3 | 2/2016 |

* cited by examiner

HOLDING COMPONENT, SUPPORT COMPONENT AND ASSEMBLY

The invention relates to a holding component with a riser card, a support component for receiving at least one holding component and an assembly.

Server systems may comprise server modules, which can be inserted in the server. In this way, a server can be constructed in a space-saving manner. Such a server module can be added by expansion components. For example, an additional graphics card can be added in order to increase calculation performance for graphics applications. To that end, plug connectors such as PCI slots are provided, into which an expansion component can be plugged. Such server modules need to fulfill predetermined dimensions and specifications in order to be mountable in a server.

The object of the invention is to describe a holding component, a support component and an assembly, in order to arrange an expansion component on a server module in an advantageous manner.

According to a first aspect, this object is achieved by a holding component with a riser card for receiving an expansion component for a computer system. The riser card comprises a first mating plug connector on a first side of a bottom plate of the holding component. The riser card comprises a first plug connector on a second side of the bottom plate opposite the first side. The holding component is configured to receive the expansion component by establishing a plug connection between a second plug connector of the expansion component and the first mating plug connector on the holding component. The holding component comprises a slot bracket, which is configured to receive a support bracket of the expansion card.

The expansion components, e.g. graphics expansion cards, may comprise support brackets in order to secure the expansion components in a computer system. The dimensions of the expansion components can significantly vary here. Some expansion components are small, but other expansion components are large. In order to integrate different expansion components in one computer system, the above-described holding component including the riser card is used. Here, a riser card is a circuit board that causes a deflection of contacts. The holding component is constructed in such a way that it can receive an expansion component, wherein the dimensions of the expansion card per se can be variable. That means a small or a large expansion card can be arranged in the holding component. The expansion component is plugged into the riser card. In addition, the support bracket of the expansion component is plugged into the slot bracket of the holding component. The support bracket can be additionally fixed in the slot bracket.

According to an advantageous embodiment, the slot bracket comprises a retaining bracket for securing the holding component of a support component. The holding component can be secured in or on a computer system. To that end, a support component can be used. The retaining bracket can be used to connect the holding component with the support component. A device can be provided on the support component, which cooperates with the retaining bracket.

According to another advantageous embodiment, the holding component comprises a first centering means, by means of which the holding component can be centered on the support component. An alternative or additional embodiment for securing the holding component on the above-described or a different support component is a centering means. The first centering means can be a hole in the bottom plate or a comparable opening in the holding component. The first centering means can also be a guiding spike or a similar protrusion.

According to another advantageous embodiment, the holding component is configured to receive an expansion card pursuant to the PCI standard. PCI expansion components can simply be plugged into a computer system in a manner known per se. If the holding component fulfills this standard, the expansion components of the PCI standard can be used. Alternatively, other standards can be supported as well.

According to a second aspect of the invention, the object is achieved by a support component for receiving at least one holding component of the above-described type. The support component comprises a fastening point for the detachable and pivotable reception of the support component on a chassis of a server module. Furthermore, the support component comprises a bottom surface with at least one opening. The support component is configured that the holding component can be arranged on the support component in a form-fit manner, so that the riser card protrudes through the opening when the holding component is arranged on the support component.

The support component is connectable with a chassis of a server module. The holding component, in particular two holding components, are connectable with the support component. Thus, the holding component is indirectly connected to the chassis of the server module. An expansion component can be inserted in the holding component. Thus, the server module can be equipped via the support component with one or multiple holding components and thus with one or multiple expansion components. Such a support component can be inserted in a simple and quick manner.

According to an advantageous embodiment, the support component comprises a second centering means for corporation with a first centering means of the holding component, in order to center the holding component on the support component. If the holding component comprises, as described above for example, a first centering means, the latter can corporate with the second centering means of the support component. For example, a pin of the support component as a second centering means engages a hole of the holding component as a first centering means.

According to an advantageous embodiment, the support component comprises a faceplate with at least one recess for a slot bracket of the holding component. The faceplate is formed in such a way that the lug of the slot bracket can be secured to the faceplate.

The faceplate can terminate one side of the support component. The recess can be adapted to the slot bracket in such a way that the faceplate terminates one side of the support component together with the slot bracket. Preferably, the faceplate comprises two recesses, in which in each case one slot bracket of in each case one support component fits. Thus, two support components and the faceplate can terminate the side of the support component. In this case, the dimensions of the expansion cards can be different from one another or be the same.

According to an advantageous embodiment, the support component comprises a backplane connection for connecting further signal lines of the expansion component with the server module. Thus, further ports of the expansions component can be connected to the server module, which are independent from the riser card. Additionally, the riser card may comprise ports which are connected to the backplane connection, in order to thus connect the riser card or further components connected to the riser card with the backplane connection and with a backplane as a result.

According to an advantageous embodiment, the support component comprises a securing device for securing the at least one support component. The securing device secures the holding component in at least one spatial direction, when the holding component is secured to the support component.

Here, the securing device may include a special configuration of one of the centering means in the support component. Additionally, or as an alternative, the securing device may include features and/or folds in the base surface of the support component. The securing device can additionally secure the holding component against slipping or lifting.

According to a third aspect of the invention, the object is achieved by an assembly. The assembly comprises a chassis of a server module with a circuit board having at least one second mating plug connector. The assembly further comprises a holding component of the above described type. Furthermore, the assembly comprises a support component of the above described type. The assembly further comprises an expansion component with a second plug connector. The second plug connector of the expansion component is plugged into the first mating plug connector on the holding component. In this way, the expansion component is secured to the holding component. The holding component is arranged on the support component in a form-fit manner. The riser card of the holding component protrudes through the opening of the support component. The expansion component can be electrically contacted with the at least one second mating plug connector of the circuit board by means of the riser card by pivoting the support component about the fastening point in the direction of the circuit board.

The assembly allows placing expansion components on the server module by means of the holding component and the support component. In particular, the base surface of the support component may serve as a cover element for the server module.

According to an advantageous embodiment, the holding component is connectable to the server module in a form-fit manner by inserting the server module in a server or by placing a cover on the support component.

If the support component is placed on the server module and inserted in a server, the support component cannot be pivoted upward by the assembly in the server, so that the movement is blocked. Additionally or alternatively, a cover can be placed over the support component and terminate the server module together with the support component. In this case as well, the support component can no longer be pivoted out of its placed-on arrangement so that the support component is connected to the server module in a form-fit manner.

Figure 2:
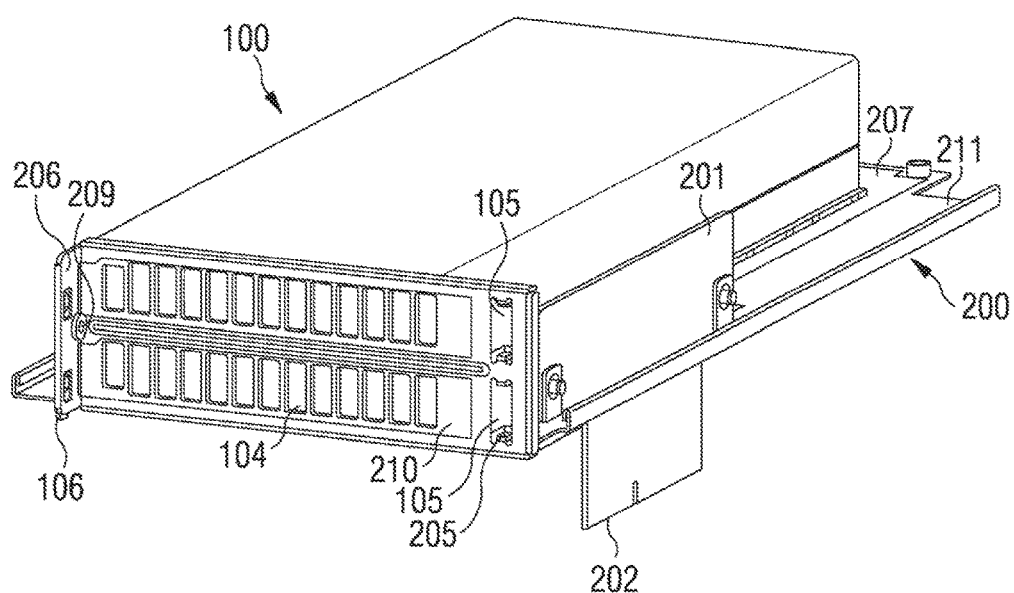
Figure 3:
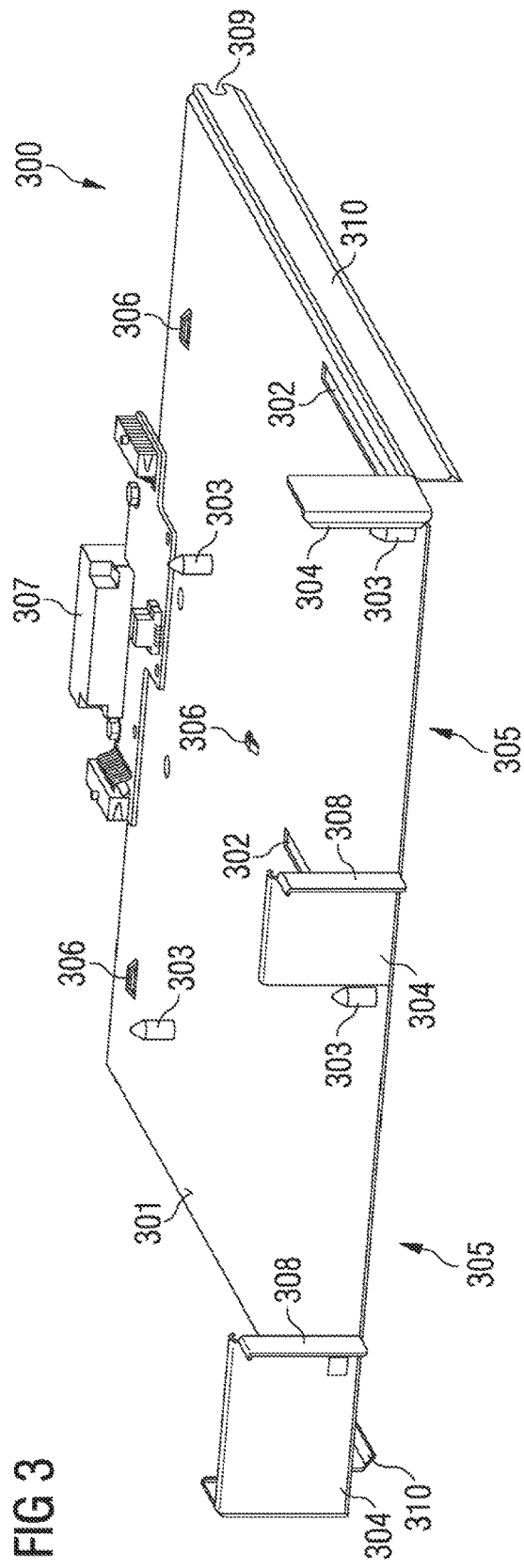
Figure 4:
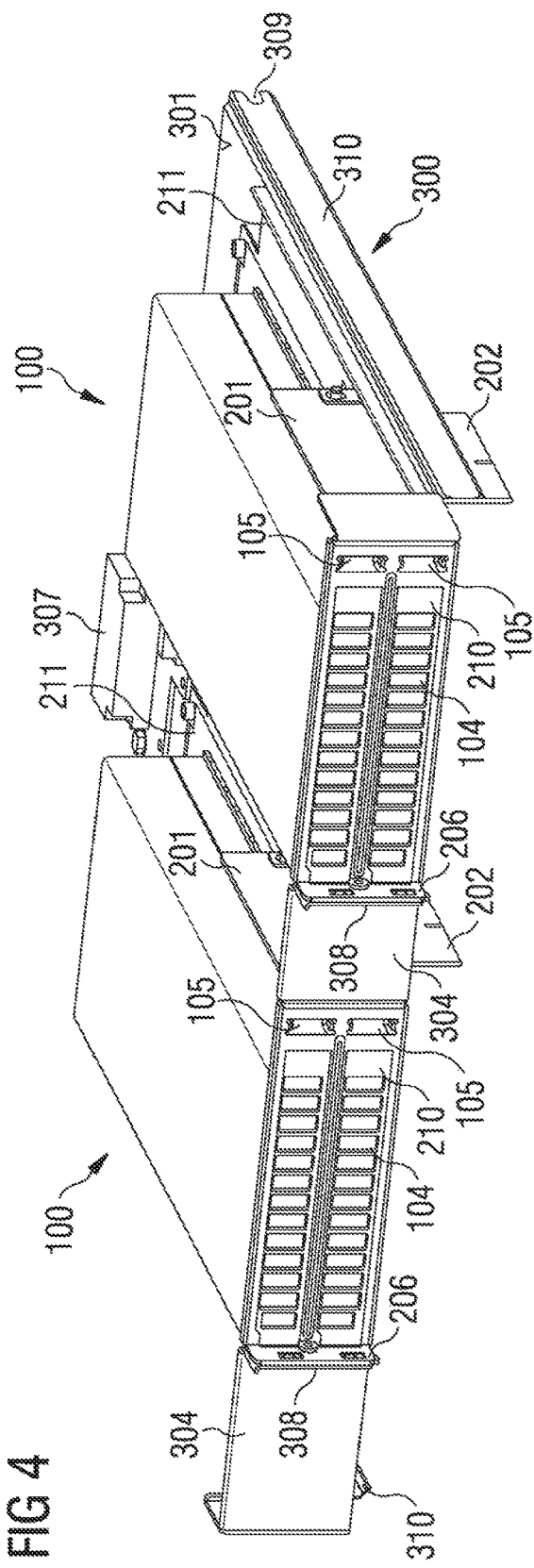
Figure 5:
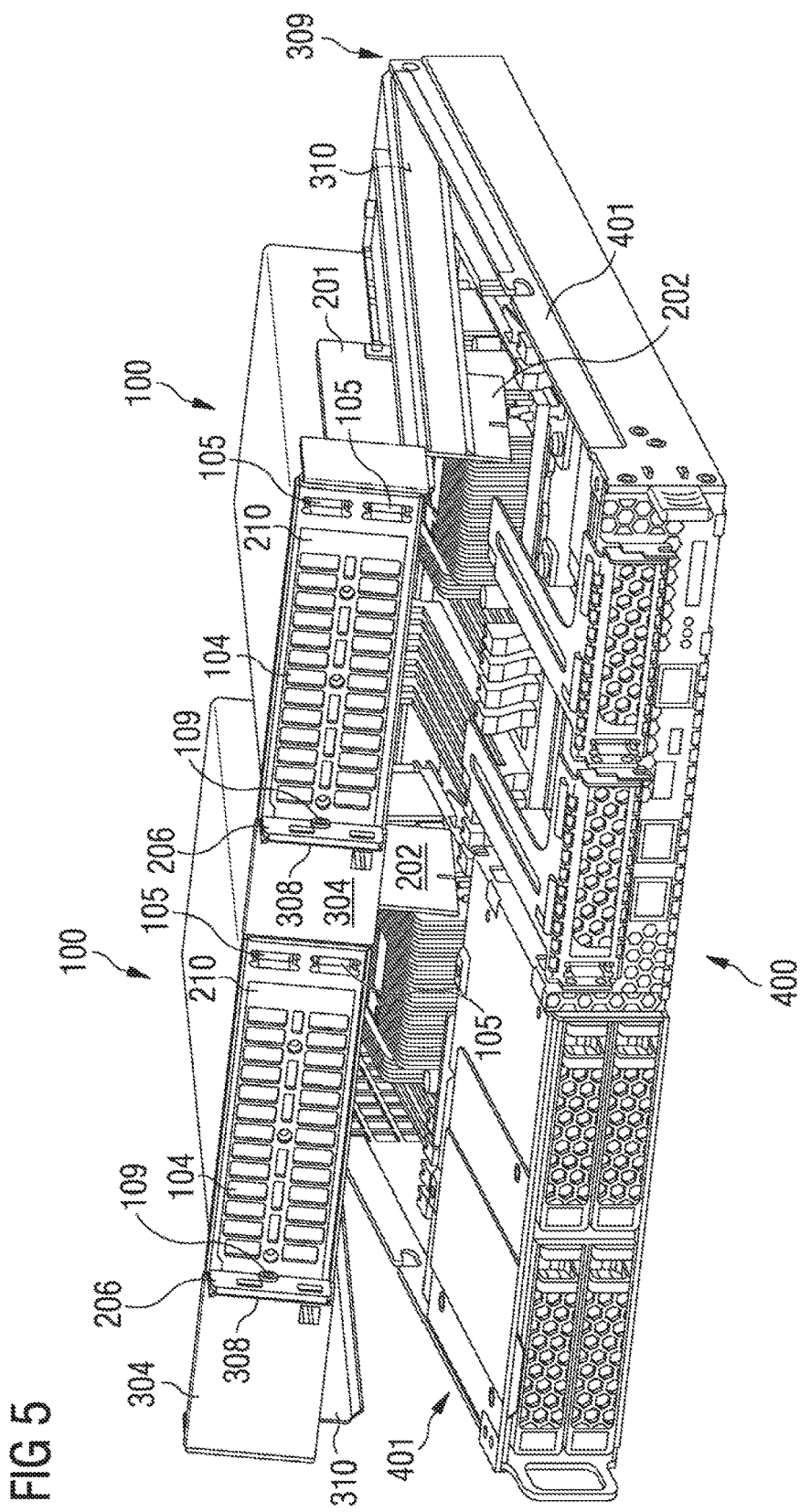
Figure 6:
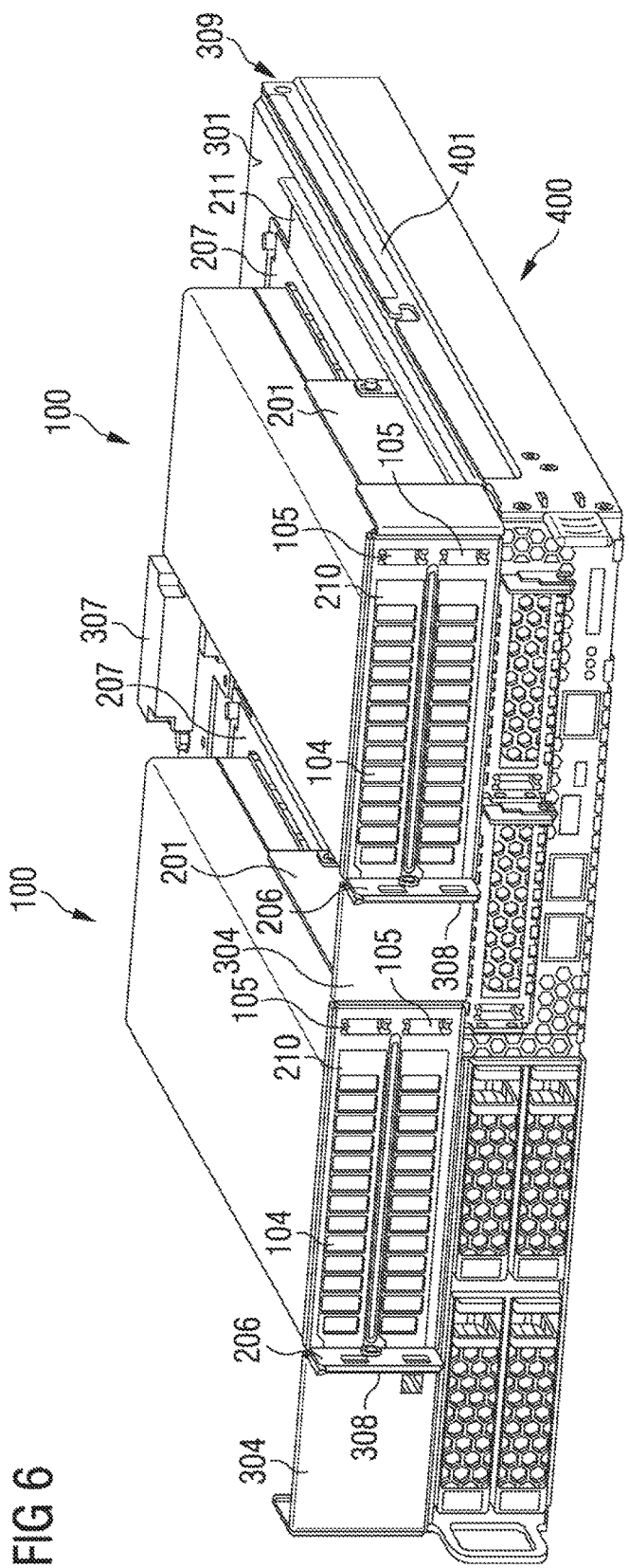

The invention will hereinafter be explained in greater detail by means of exemplary embodiments and the Figures. The figures show in:

FIG. 1 an expansion component and a holding component,

FIG. 2 the expansion component in connection with the holding component,

FIG. 3 a support component,

FIG. 4 an assembly with the support component with two expansion components inserted in holding components, FIG. 5 a server module with the assembly of FIG. 4, and FIG. 6 a further assembly according to the example of FIG. 5.

FIGS. 1 to 6 are illustrations of an exemplary embodiment according to the invention. Here, FIGS. 1 to 4 constitute parts of the assemblies 5 and 6.

Accordingly, like components are indicated with like reference numerals throughout the figures.

Of course, the illustration of the FIGS. 1 to 6 and the reference to an exemplary embodiment are merely exemplary. Accordingly, individual components may deviate from one another. In particular, modifications and deviations to the illustrated figures described in conjunction with an individual figure shall not exclude any combination of the individual components, in particular if their description deviates from the components illustrated in the drawings.

FIG. 1 shows an expansion component 100 for a computer system and a holding component 200. Here, the computer system is a server comprising server modules 400. In the exemplary embodiment, the expansion component 100 is a graphics unit, in particular a General Purpose Computation on Grafics Processing Unit, GPGPU module, for short. A GPGPU can increase the computing capacity of a server and/or a server module. Here, use of the GPGPU is not exclusively limited to graphics applications. In other embodiments, the expansion component 100 can be a different component. For example, the expansion component 100 is a graphics card, an additional battery pack, a network adaptor or another structural element for a computer system.

The holding component 200 comprises a base plate 211. The side on which an expansion component 100 can be placed is a top side of the holding component 200. The opposite side is a bottom side of the holding component 200. The holding component 200 comprises a riser card 201. The riser card 201 comprises a first plug connector 202 and a first mating plug connector 203. The riser card 201 is arranged on a lateral edge of the holding component 200 in such a way that the first plug connector 202 is arranged on the bottom side and the first mating plug connector 203 is arranged on the top side. In other words, the first plug connector 202 protrudes from the bottom plate 211 of the holding device 200, while the first mating plug connector 203 is arranged on the top side of the holding component 200. The riser card thus protrudes from a top side of the holding component 200 through the holding component 200 from a bottom side of the holding component 200. Alternatively, the riser card 201 is arranged outside the dimensions of the holding components 200 and protrudes past the holding component 200.

Die expansion component 100 can be arranged on the top side of the holding component 200, where the first mating plug connector 203 is arranged. To that end, the expansion component 100 comprises an expansion card 101 having a second plug connector 102. The second plug connector 102 can be plugged into the first mating plug connector 203 of the riser card 201. The simple plugging of the expansion component 100 into the riser card 201 of the holding component 200 can be sufficient to secure the expansion component 100 on the holding component 200. Alternatively, the expansion component 100 comprises a second plug connector 102 without expansion card 101. The second plug connector 102 forms a holding element here.

In addition, the holding component 100 comprises a support bracket 103. The support bracket 103 comprises ventilations lots 104. The support bracket 103 comprises at least one insertion lug 105. In the exemplary embodiment shown, the support bracket 103 comprises two insertion lugs 105. The support bracket 103 comprises a first holding lug 106.

The holding component 200 comprises a slot bracket 204. The slot bracket 204 comprises two folds 205, into which the insertion lugs 105 can be inserted in order to retain the mounting bracket 103 to the slot bracket 204. Furthermore, the slot bracket 204 comprises a second holding lug 206. If the insertion lugs 105 are inserted in the fold 205, the first holding lug 106 rests against the second holding lug 206.

Just like the support bracket may comprise one single insertion lug 105, the slot bracket 204 may comprise one single fold 205. The support bracket 103 and the slot bracket 204 engage one another independently from the number of the first or second holding lugs 106, 206, the insertion lugs 105 and folds 205 in such a way that the support bracket 103 can be fixed to the slot bracket 204.

The support bracket 103 is secured to the expansion component 100. The expansion component 100 is automatically fixed to the holding component 200 by fixing the mounting bracket 103 to the slot bracket 204. This contributes to the fixing of the expansion components 100 by the second plug connector 102 in the first mating plug connector 203. If the first holding lug 106 and the second holding lug 206 are connected to one another, for example by a screw-connection or a clicking, the second plug connector 102 is also blocked thereby in such a way that it cannot be unplugged from the first mating plug connector 203.

The holding component 200 comprises an insulation 207. In the exemplary embodiment, this insulation is an insulating foil which is arranged on the base surface of the holding component 200 and which is to protect the bottom side of the expansion card 101 of the expansion component 100.

The holding component 200 comprises a first centering means 208. In the exemplary embodiment, the first centering means 208 is a hole, in particular an elongated hole. The description of the functionality of the first centering means 208 will be given below with reference to FIG. 3.

FIG. 2 shows an assembly of the expansion component 100 in the holding component 200. The second plug connector 102 is plugged into the first mating plug connector 203 of the riser card 201 in an electrically contacting manner (not visible for reasons of perspective).

The insertion lugs 105 are inserted in the folds 205. The first holding lug 106 rests against the second holding lug 206. The second holding lug 206 comprises a screw 209 which engages in a hole 107 of the first holding lug 106. Alternatively, the screw 209 may be a spike or another centering means.

In this arrangement, the expansion component 100 is held by the plug connection of the second plug connector 102 having the first mating plug connector 203 as well as by the connection of the mounting bracket 103 and the slot bracket 104. Depending on the size and stability of the expansion component 100, it is possible that a part of the expansion component 100 located in the rear in the Figure rests on the holding component 200. To that end, the holding component 200 is covered with the insulation 207, which prevents electric shot-circuits.

Here, the ventilation slots 104 are arranged on the slot bracket 204 in such a way that the ventilation slots 104 are located behind the slot bracket openings 210. The expansion component 100 can thus be ventilated.

In each case one support component 300 is illustrated in FIGS. 3 and 4. In FIG. 4, two holding components 200 according to FIG. 2, i.e. with the expansion components 100 inserted, are inserted in the support component 300. The support component 300 comprises a base surface 301. The base surface 301 comprises openings 302. The base surface 301 comprises as many openings 302 as provided for the insertion of the holding components 200. In the example shown, the support component 300 comprises two openings 302, through which in each case one riser card 201 can be plugged.

The support component 300 further comprises second centering means 303. In the exemplary embodiment shown, the second centering means 303 are pins, which protrude in a normal direction from the base surface 301. The second centering means 303 are arranged in such a way that the first centering means 208 of the holding component 200 are capable of cooperating with the second centering means 303 of the support component 300. In the exemplary embodiment this means that in each case the first centering means 208, i.e. the holes of the holding component 200, can be slid over the second centering means 303, i.e. the pins of the base surface 301.

The riser card 201 of the holding component 200, in particular the first plug connector 202 and the part of the riser card 201 protruding under the holding component 200 engages through the opening 302 during the insertion of the holding component 200. Here, the first plug connector 202 does not enter into an electric connection with the support component 300. In the exemplary embodiment, the riser card 201 does not enter a mechanic connection with the support component 300, in particular the openings 302 and the base plate 301. The holding component 200 is held in position by the first centering means 208 and the second centering means 208. In an alternative embodiment, the riser card may enter into a mechanic connection with the opening 302, which contributes to the holding of the holding component 200.

The support component 300 comprises a faceplate 304. The faceplate 304 is arranged in such a way that it can enter into a connection with the slot brackets 204, respectively the mounting brackets 203, when the holding components 200 are inserted in the support component 300. The faceplate 304 comprises two recesses 305 for the reception of the slot bracket 304. A width of the recess 305 corresponds to a width of the slot bracket 204 here. The height of the faceplate 304 corresponds to the height of the slot bracket 204 and thus to the height of a server plugin. Of course, the heights can be different from the height of the server plugin. For example, the faceplate 304 may correspond to the height of the server plugin, but the slot bracket 204 and the recesses 305 are lower. In the exemplary embodiment shown, the faceplate 304 is interrupted by the recesses 305 in such a way that the faceplate 304 is formed of individual faceplate parts.

If the holding components 200 are inserted in the support component 300, the faceplate 304 and the slot brackets 204 together form a closed housing side for a server module which is interrupted by the slot bracket openings 210.

The support component 300 comprises a safety device 306. In the illustrated embodiment, the safety device 306 has various features on the base surface 301 in the support component 300. The safety device 306 restricts the holding component 200 when it is inserted in the support component 300 in spatial directions running parallel to the top surface of the base surface 301. In addition, the safety component 306 can restrict the holding component 200 in a spatial direction running vertically to the base surface 301, when the holding component 200 is inserted in the support component 300. To that end, the safety device 306 may comprise screws and correspondingly screw holes. Additionally or alternatively, the safety device 306 can be configured in such a way that lugs of the holding components 200 engage the features of the support component 3200 or vice versa and the holding component 200 is held in multiple spatial directions as a result.

In a not-illustrated embodiment, the second centering means 303 of the support component 300 comprise a latch device, into which the first centering means 208 of the holding component 200 can engage. In this embodiment, the first centering means 208 and the second centering means 303 are part of the safety device. Just as well, the first holding lug 106 and the second holding lug 206 can be part of the safety device 306.

Furthermore, the support component 300 comprises a backplane connection 307. The backplane connection 307 is configured to be connected to a backplane of a server module 400 (see FIGS. 5 and 6 for the server module), when the support component 300 is placed on a server module 400.

The support component 300 comprises side folds 310 in order to guide the support component 300 in a server module 400, as described herein below with reference to FIG. 6. In addition, the side folds 310 stabilize the support component 300.

In the exemplary embodiment, the riser cards 201 of the holding components 200 comprise additional ports, which can also be connected to the backplane connection 307.

FIG. 4 shows an assembly of two expansion components 100 on in each case one holding component 200, wherein the two holding components 200 are inserted in the support component 300. Here, each of the riser cards 201 engages through the openings 302 of the base surface 301 of the support component 300 by means of the first plug connectors 202. The first plug connector 202 of the riser cards 201 thus protrude from a bottom side of the support component 300. The bottom side is located opposite the side on which the holding components 200 are placed.

The faceplate 304 comprises angle brackets 308 on the recesses 305. FIG. 4 shows that when the holding components 200 are placed on the support component 300, the second holding lugs 206 rest against the angle brackets 308 in such a way that in each case a first holding lug 106 of a mounting bracket 103 of an expansion component 100 are arranged between a second holding lug 206 and an angle bracket 308. In this way, the mounting bracket 103 is secured between the corresponding second holding lug 206 and the corresponding angle bracket 308.

The second holding lug 206 comprises a fold which engages round the side of the first holding lug 1β6 opposite the expansion components 100 and is in contact with the angle brackets 308 so that a closed housing side is formed. Alternatively, the fold projects above the first holding lug 106 in a contact-less manner. A closed housing side is formed in this way as well.

FIG. 5 shows an assembly of a server module 400 and the support component 300 according to FIG. 4 with inserted holding components 200 and with two expansions components 100. The server module comprises side walls 401. The support component 300 is inserted with a fastening point 309 on a corresponding point of the server module 400. In this embodiment, the support component 300 comprises two fastening points 309 on opposite sides of the side of the support component 300, which are located opposite the recesses 305. For reasons of perspective, the rear one of the two fastening points 309 is not visible in FIGS. 5 and 6.

In the assembly according to FIG. 5, the support component 300 is inserted in the fastening points 309 in a releasable manner. The first plug connectors 202 of the riser cards 201 protrude from below the support component 300 and protrude in the direction of the server module 400. The server module 400 comprises a circuit board (under the structural elements in the chassis), on which second mating plug connectors are arranged. Due to the construction of the server module, the second mating plug connector can not be discerned in FIG. 5, since they are hidden by the structural element. The second mating plug connectors are located on the circuit board at a position, which is located below the first plug connectors 202 in such a way that the first plug connectors 202 engage in the second plug connectors when the support component 300 is pivoted downward about the fastening point 309 and rests on the server module 400.

FIG. 6 shows the assembly according to FIG. 5, after the support component 300 was pivoted downward. It can not be discerned here that the first plug connectors 202 engage in the second mating plug connectors on the circuit board of the server module 400 and thus establish an electric contact between the expansion components 100 and the server module 400.

In the assembly according to FIG. 6, both expansion components 100 are connected to the circuit board of the server module via the riser cards 201. The faceplate 304 of the support component 300 as a whole has the width of the server module 400 and terminates on both sides with the server module 400. The base surface 301 of the support component 300 forms a cover for the server module 400. The lateral folds 310 of the support component 300 rest against the side walls 401. In the exemplary embodiment, the lateral folds 310 rest against the side walls 401 from the inside. For a better hold, the side folds 310 comprise bulges that cause the support component 300 to be clamped between the side walls 401. This clamping increases a frictional resistance so that the lifting of the support component 300 or pivoting it upward from the lowered state of the server module 400 is made difficult.

A lid can be placed on the assembly according to FIG. 6. Alternatively, or additionally, the assembly can be inserted in a server as shown in FIG. 6 with or without a cover. If the assembly according to FIG. 6 is inserted or plugged into a server, there is a module having a bottom plate located above the assembly. Thus, the last degree of freedom of the support component 300 in the server module 400, namely a pivot in the upward direction, can be impeded both by a cover and by an insertion into a server. The support component 300 is connected to the server module 400 in a form-fit manner now.

LIST OF REFERENCE NUMERALS 100 expansion component
101 expansion card
102 second plug connector
103 mounting bracket
104 ventilation slot
105 insertion lug
106 first holding lug
107 hole
200 holding component
201 riser card
202 first plug connector
203 first mating plug connector
204 slot bracket
205 fold
206 second holding lug
207 insulation
208 first centering means
209 screw
210 slot bracket opening
211 base plate
300 support component
301 base surface
302 opening 303 second centering means
304 faceplate
305 recess
306 safety device
307 backplane connection
308 angle bracket
309 fastening point
310 lateral fold
400 server module
401 side wall

The invention claimed is:

1. A holding component with a riser card for receiving an expansion component for a computer system, wherein the riser card comprises a first mating plug connector on a first side of a bottom plate of the holding component and a first plug connector on a second side of the bottom plate opposite the first side, the riser card being arranged perpendicular to the bottom plate and protruding from the first side of the bottom plate through the bottom plate from the second side of the bottom plate, wherein the holding component is adapted to receive the expansion component by establishing a plug connection of a second plug connector of the expansion component and the first mating plug connector on the holding component, wherein the holding component comprises a slot bracket which is adapted to receive a slot angle of the expansion component.

2. The holding component according to claim 1, wherein the slot bracket has a retaining bracket for fixing the holding component on a support component.

3. The holding component according to claim 1, wherein the holding component comprises a first centering means by means of which the holding component can be centered on a support component.

4. The holding component according to claim 1, wherein the holding component is adapted to receive an expansion component according to the PCI standard.

5. A support component for receiving at least one holding component with a riser card for receiving an expansion component for a computer system, wherein the riser card comprises a first mating plug connector on a first side of a bottom plate of the holding component and a first plug connector on a second side of the bottom plate opposite the first side, wherein the holding component is adapted to receive the expansion component by establishing a plug connection of a second plug connector of the expansion component and the first mating plug connector on the holding component, wherein the holding component comprises a slot bracket which is adapted to receive a slot angle of the expansion component, and
   wherein the support component comprises a fastening point for removably and pivotably receiving the support component on a chassis of a server module and a base face with at least one opening;
   wherein the support component is adapted such that the holding component can be arranged in a form-fit manner on the support component so that the riser card of the holding component protrudes through the opening when the holding component is arranged on the support component.

6. The support component according to claim 5, wherein the support component comprises a second centering means for interaction with a first centering means of the holding component in order to center the holding component on the support component.

7. The support component according to claim 5, having a faceplate with at least one recess for a slot bracket of the holding component, wherein the faceplate is configured such that a retaining bracket of the slot bracket can be fixed to the faceplate.

8. The support component according to claim 5, wherein the support component comprises a backplane connection for connecting further signal lines of the expansion component to the server module.

9. The support component according to claim 5, comprising a securing device for securing the at least one holding component in at least one spatial direction, when the at least one holding component is fixed to the support component.

10. The support component according to claim 6, comprising a securing device for securing the at least one holding component in at least one spatial direction, when the at least one holding component is fixed to the support component.

11. An assembly, comprising:
   a holding component with a riser card for receiving an expansion component for a computer system, wherein the riser card comprises a first mating plug connector on a first side of a bottom plate of the holding component and a first plug connector on a second side of the bottom plate opposite the first side, wherein the holding component is adapted to receive the expansion component by establishing a plug connection of a second plug connector of the expansion component and the first mating plug connector on the holding component, wherein the holding component comprises a slot bracket which is adapted to receive a slot angle of the expansion component;
   a support component for receiving the holding component, wherein the support component comprises a fastening point for removably and pivotably receiving the support component on a chassis of a server module and a base face with at least one opening;
   wherein the support component is adapted such that the holding component can be arranged in a form-fit manner on the support component so that the riser card of the holding component protrudes through the opening when the holding component is arranged on the support component;
   the chassis of the server module with a printed circuit board having at least one second mating plug connector; and
   the expansion component with the second plug connector;
   wherein the second plug connector of the expansion component is plugged into the first mating plug connector on the holding component and thus the expansion component is fixed on the holding component, and wherein the holding component is arranged on the support component in a form-fit manner so that the riser card of the holding component protrudes through the opening, and wherein the expansion component can be electrically contacted to the at least one second mating plug connector of the printed circuit board by means of the riser card of the holding component by pivoting the support component around the fastening point in the direction of the printed circuit board.

12. The assembly according to claim 11, wherein the support component can be connected to the server module in a form-fit manner by inserting the server module into a server or placing a cover onto the support component.

* * * * *